United States Patent [19]

Williams

[11] Patent Number: 4,480,835
[45] Date of Patent: Nov. 6, 1984

[54] CARTRIDGE ADAPTER FOR PROGRAMMABLE VIDEO GAMES

[76] Inventor: Theodore R. Williams, 1927 Clifton, Royal Oak, Mich. 48073

[21] Appl. No.: 471,329

[22] Filed: Mar. 2, 1983

[51] Int. Cl.³ ............................................. A63B 71/04
[52] U.S. Cl. ............................ 273/148 B; 339/154 A
[58] Field of Search ................... 273/1 R, 1 E, 148 B, 273/DIG. 28; 339/153 R, 154 R, 154 A, 155 R

[56] References Cited

U.S. PATENT DOCUMENTS

| | | | |
|---|---|---|---|
| 4,156,928 | 5/1979 | Inose et al. | 273/DIG. 28 X |
| 4,218,110 | 8/1980 | Giannaula et al. | 339/154 A |
| 4,352,492 | 10/1982 | Smith | 273/DIG. 28 X |

*Primary Examiner*—William H. Grieb
*Attorney, Agent, or Firm*—Barnes, Kisselle, Raisch, Choate, Whittemore & Hulbert

[57] ABSTRACT

An adapter for coupling a program cartridge to a programmable video game console comprising a hollow shell of integral molded plastic construction which includes a first shell section adapted internally to receive a program cartridge and a second shell section adapted to be internally received into the cartridge opening of a console. A female card-edge connector is positioned within the shell so as to receive the male card-edge connection in the cartridge, and a printed circuit card is connected to the shell female connector and extends through the second section of the shell for reception and connection to a corresponding female connector within the console. Fingers projecting within the shell are adapted to cooperate with movable flaps in the cartridge and console for removing protective covering from adjacent to the respective cartridge and console connections.

5 Claims, 8 Drawing Figures

CARTRIDGE ADAPTER FOR PROGRAMMABLE VIDEO GAMES

The present invention is directed to programmable video controllers, and more particularly to TV video games and like devices which are adapted to be programmed by removable insertion of a game cartridge.

TV video games of the described type typically include a microprocessor-based console adapted for connection to a TV or other CRT display console, and one or more cartridges adapted to be removably connected to the console to program the console for a particular game. The console typically includes control devices, such as power and reset switches, and is connected to remote operator control devices such as joystick or keyboard controllers. The console also includes control and display drive circuitry common to all games, while the individual cartridges include read-only-memories or the like containing the program or software unique to the specific game.

Electrical coupling between the cartridge and console is accomplished through mating card-edge connection means disposed within the cartridge and console respectively. These connection means typically are protected against dirt and inadvertent contact by slidable flaps or covers which are moved out of covering position by insertion of the cartridge. All present programmable TV video games operate on this principle, although cartridges adapted for use with one brand of console typically cannot be used with a console marketed by a different manufacturer.

One problem that has presented itself is wear on the cartridge card-edge connection caused by repeated insertion and removal from the console. Faulty electrical connection between the cartridge and console results in improper operation of the video game, and typically leads to replacement of the game cartridge. Another problem is that at least some consoles are constructed to receive the cartridges in an orientation which makes it difficult for an operator to view the cartridge label. An object of the present invention is to provide an adapter which remedies the aforementioned deficiencies in the art.

The invention, together with additional objects, features and advantages thereof, will be best understood from the following description, the appended claims and the accompanying drawings in which:

The drawings illustrate a presently preferred embodiment of the adapter of the present invention in use with an ATARI video game marketed by Warner Communications. It will be understood that the adapter could also be configured for use with cartridges and consoles marketed by other manufacturers without departing from the scope and principles of the invention.

Figure 3:
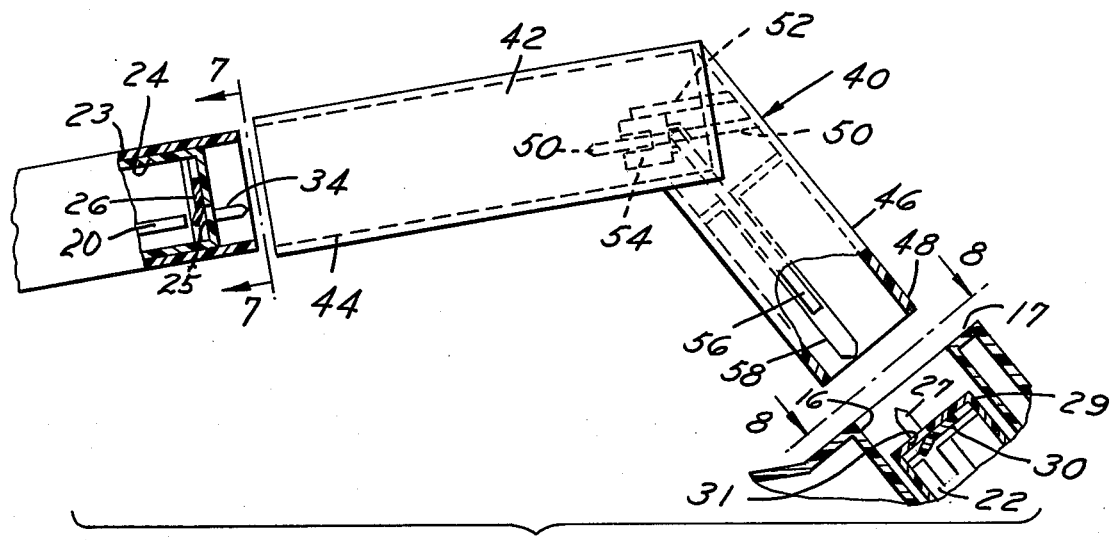
FIGS. 3 and 4 are fragmentary partially sectioned elevational views of such connection arrangement before and after assembly respectively.
Figure 4:
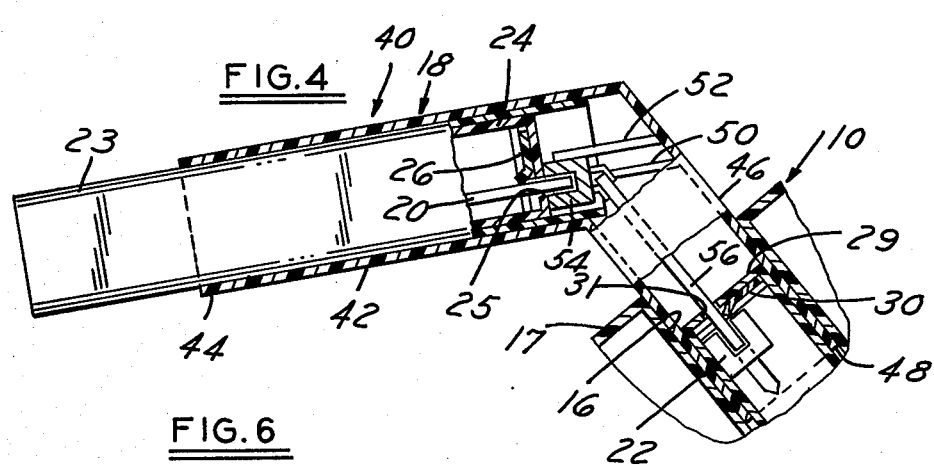

A typical video game of the type illustrated in the drawings includes a console 10 having internal microprocessor-based electronics (not shown) common to all of the video games for that manufacturer, and circuitry for controlling an external video console or TV (likewise not shown). Switches 12 are provided on console 10 for controlling application of power to the console, selecting a particular game number or level, and resetting the game upon completion, etc. Likewise, operator control devices, such as the joystick 14, are removably or fixedly connected to console 10 for playing the game. An opening 16 is provided on a sloping front wall 17 of console 10 for removably receiving a game cartridge 18. The outline or geometry of opening 16 is such as to cooperate with the generally rectangular outline of cartridge 18 so as to adapt console 10 to receive a particular type or class of cartridge unique to the type of console in question. Cartridge 18 includes circuitry and software for programming console 10 to play the specific game associated with that cartridge. The cartridge circuitry (not shown) is mounted on a printed circuit board or card 20 (FIGS. 3 and 4). One end of card 20 is configured as a male card-edge connector and is adapted to be electrically connected to a corresponding female card-edge connector 22 (FIGS. 3 and 4) disposed within console 10 when cartridge 18 is inserted into console opening 16. Female connector 22 is, of course, connected to the internal console circuitry.

Figure 7:
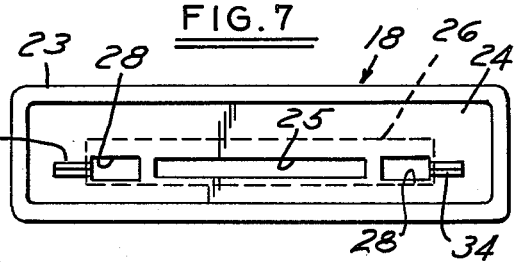
FIGS. 7 and 8 are elevational views of the mating sections of the cartridge and console respectively.
Figure 8:
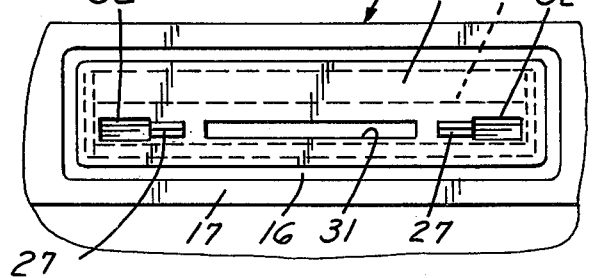

Cartridge 18 includes an open-ended housing 23 and a cover 24 slidably disposed within housing 23 adjacent to the open end thereof. A slot 25 in the outwardly facing wall of cover 24 is aligned with card 20. A flap 26 is slidably carried by cover 24 for motion perpendicular to the plane of card 20. Cover 24 and flap 26 are normally biased by a spring (not shown) to the position illustrated in FIG. 3 wherein flap 26 cover slot 25 and cover 24 is adjacent to the open end of housing 23 so as to protect the connection edge of card 20 against accidental contact and dirt, etc. The outer face of cover 24 includes a pair of slots 28 (FIG. 7) which are positioned laterally adjacent to slot 25 and adapted to receive fingers or tabs 27 projecting outwardly within console opening 16 for first sliding flap 26 with respect to cover 24 to open slot 25, and then sliding the flap and cover to cartridge housing 23 so as to expose the edge of card 20 through slot 25. On console 10, a fixed cover 29 (FIGS. 2-4 and 8) encompasses female card-edge connector 22 and has a flap 30 slidably disposed therein over a slot 31 aligned with connector 22. A pair of slots 32 positioned laterally outwardly of tabs 27 in alignment with slot 31 in the outer face of console cover 29 are adapted to receive the fingers or tabs 34 carried by cartridge cover 24 for sliding console flap 30 away from connector 22, and thus to expose the connector for reception of card 20.

Figure 1:
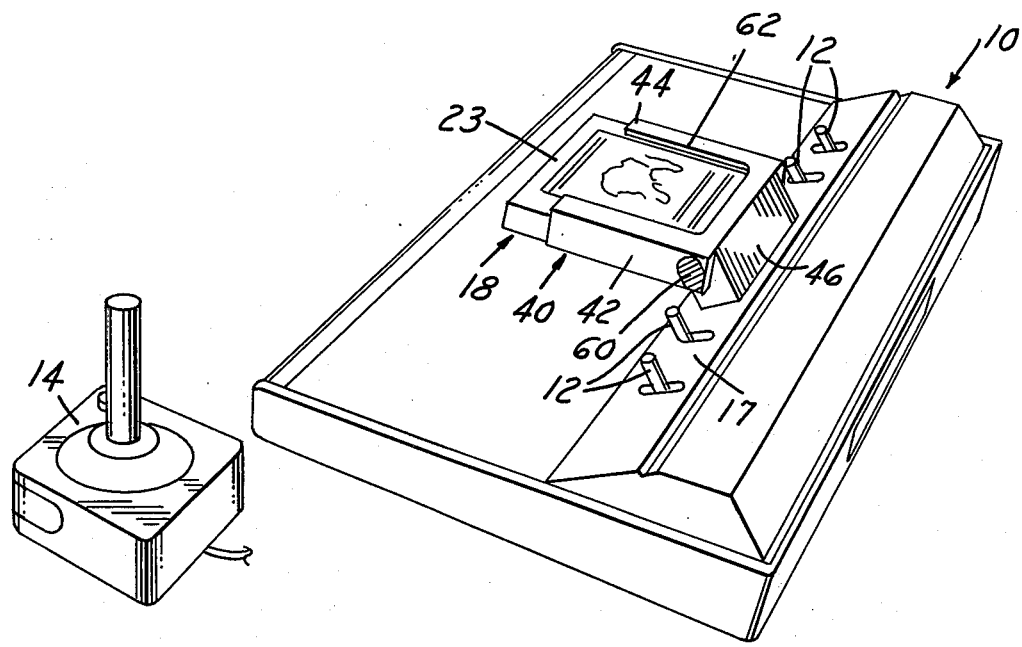
FIG. 1 is a perspective view of a TV video game console and program cartridge equipped with a cartridge adapter in accordance with the invention.
Figure 2:
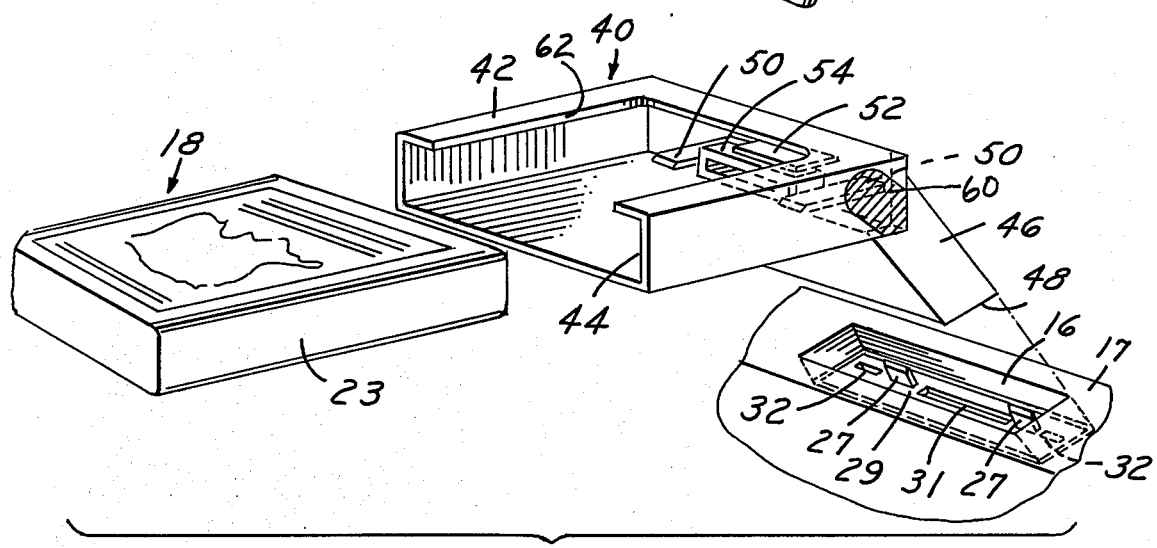
FIG. 2 is a fragmentary exploded view of the cartridge-adapter-console connection arrangement.

In accordance with the present invention, an adapter 40 is provided for receiving cartridge 18 and plugging cartridge 18 into console 10. More specifically, adapter 40 includes a hollow one-piece shell having a first section 42 of rectangular outline with an open end 44 adapted internally to receive cartridge 18, and a second section 46 of generally rectangular outline having an open second end 48 adapted and configured to be internally received within console opening 16. The central planes of shell sections 42,46 are preferably at an acute angle with respect to each other so as to orient a cartridge 18 received into adapter 40 in a generally horizontal orientation, as illustrated in FIG. 1. In the specific embodiment and application of the adapter illustrated in the drawings, this acute angle is equal to substantially 60°. Shell section 42 is closed by a perpendicular wall 52 remote from open end 44.

A pair of fingers or tabs 50 (FIGS. 2 and 3) are positioned so as to be received within slots 28 in a cartridge 18 fitted within shell section 42. A female card-edge connector 54 is positioned within shell section 42 to receive cartridge card-edge 20 when cartridge 18 is inserted into shell section 42. Thus, when a cartridge 18 is inserted into shell section 42, tabs 50 first engage flap 26 through slots 28 and uncover cartridge slot 25. Continued cartridge insertion brings cover 24 into abutment with the opposing face of connector 54, which pushes cover 24 into cartridge housing 23 and exposes card 20 through slot 25. In the fully inserted position (FIGS. 1 and 4), the edge of card 20 is received in connector 54 and electrically coupled to the contacts thereof. In the specific embodiment shown in the drawings, tabs 50 project from an opposing surface of shell section 46 and connector 54 is mounted to a flat finger 52 projecting from the same surface.

Figure 6:
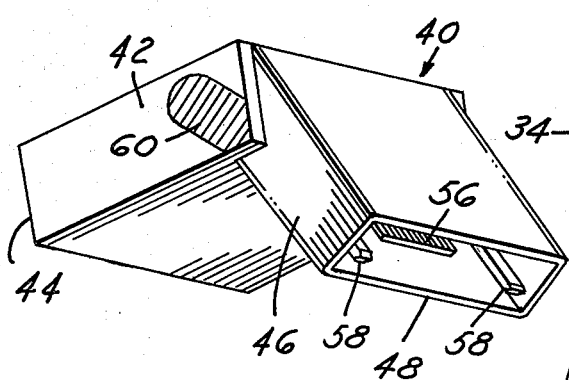
FIG. 6 is a perspective view of the adapter assembly.

A printed circuit card 57 is soldered or otherwise electrically and mechanically connected to connector 54 and projects in fixed position through the length of shell section 46 to adjacent section end 48. A pair of laterally spaced tabs or fingers 58 (FIGS. 3 and 6) are fixedly mounted within shell section 46 adjacent to open shell end 48 and are adapted to be received within slots 32 (FIGS. 2 and 8) in console 10 so as to move flap 30 from blocking connection to connector 22 as previously described. Thus, with shell end 46 fully inserted into console opening 16, the edge of circuit card 56 adjacent to open shell end 48 is received in and electrically connected to console connector 22, and thus to the console circuitry.

Figure 5:
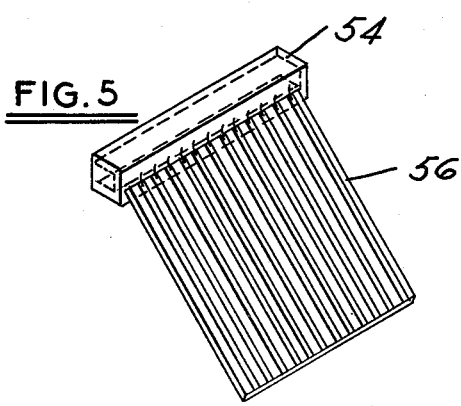
FIG. 5 is a perspective view of a portion of the cartridge adapter.

Shell sections 42,46, wall 52 and fingers 50,58 are preferably of integral molded plastic construction. Connector 54 and circuit card 56 may be assembled as a subassembly as illustrated in FIG. 5, and then mounted to wall 52 within the adapter shell. In use, cartridge 18 is first inserted into shell section 42 until cartridge card edge 20 mates with adapter connector 54. Shell section 46 may then be inserted into console opening 16 when play of the game represented by cartridge 18 is desired. Preferably, finger ridges 60 are provided on the side walls of shell section 42 adjacent to shell section 46 to facilitate insertion and removal from the console. The wear of repeated connection and disconnection is thus absorbed by circuit card 56 rather than cartridge card 20 so that, in the event of failure due to wear and tear, adapter 40 may be removed from cartridge 18 and replaced by a new adapter at substantially less expense than would be involved in replacement of cartridge 18 itself. Furthermore, it will be noted in FIG. 1 that angulated disposition of integral shell sections 42,46 orients cartridge 18 in a horizontal plane. Preferably, the upper wall of shell section 42 is provided with an opening 62 which exposes the label of cartridge 18 for observation by a user.

The invention claimed is:

1. In a programmable video controller which includes a console adapted for connection to a video display and a program cartridge adapted to be removably affixed to said console for programming said console, said console having an opening adapted to receive said cartridge and a first connector of predetermined polarity disposed within said console, said cartridge having a predetermined configuration adapted to be inserted into said opening and having a second connector disposed within said cartridge of opposite polarity to said first connector for mating engagement therewith when said cartridge is inserted into said console opening, means adapted for removably coupling said cartridge to said console comprising a hollow shell having an open first end contoured to internally receive a said cartridge and a second end contoured to be internally received within said console opening, first connection means identical to said second connector and disposed within said shell for mating engagement with said first connector within said cartridge when a said cartridge is received within said shell, and second connection means within said shell electrically connected to said first connection means and identical to said first connector for mating engagement with said second connector within said console when said second end of said shell is received into said console opening.

2. The invention set forth in claim 1 wherein said shell comprises a one-piece body of molded plastic construction having a first section adapted internally to receive said cartridge, and a second section at a predetermined angle with respect to said first section and adapted to be received within said console opening so as to position said cartridge at a predetermined orientation with respect to said console.

3. The invention set forth in claim 2 wherein said cartridge and said console include movable guard means normally protecting said first and second connectors and adapted to be responsive to insertion of said cartridge into said console opening for repositioning said guard means so as to permit said mating engagement between said first and second connectors, and wherein said shell further includes means adapted to cooperate with said guard means in said cartridge and said console to permit electrical connection of said connectors through said first and second connection means.

4. The invention set forth in claim 3 wherein said first connection means comprises a female card-edge connector fixedly disposed within said shell at an end of said first shell section remote from said first opening, and wherein said second connection means comprises a printed circuit card electrically connected to said female card-edge connector and extending in fixed position through said second section of said shell to adjacent said second opening.

5. For use with a programmable video game or the like which includes a console having an opening of predetermined outline and female card-edge connection means disposed within said console adjacent to said opening, and a program cartridge having a predetermined geometry corresponding to said opening outline so as to be adapted to be received within said console opening and male card-edge connection means disposed within said cartridge and adapted for electrical mating engagement with said female card-edge connection means in said console, an adapter for removably coupling said cartridge to said console comprising a one-piece hollow shell of molded plastic construction having a first section of uniform geometry corresponding to said outline of said console opening with an open first end adapted to receive a said cartridge, and a second section integral with said first section and having a uniform geometry corresponding to said cartridge geometry with an open second end remote from said first section and adapted to be received with said console opening, said first and second shell sections being of rectangular geometry and being oriented at a predetermined acute angle with respect to each other, female card-edge connection means disposed within said first section of said shell in fixed position remotely of said open end and adapted for electrical mating engagement with a said cartridge when the cartridge is inserted into said first section of said shell, and male card-edge connection means comprising a printed circuit card electrically connected to said female card-edge connection means in said shell and extending in fixed position through said second section of said shell to adjacent said second end for electrical connection to said console when said second section of said shell is inserted into said console.

* * * * *